United States Patent
Suzuki (10) Patent No.: US 6,496,747 B1
(45) Date of Patent: Dec. 17, 2002

(54) SEMICONDUCTOR DEVICE MANUFACTURING APPARATUS AND INFORMATION PROCESSING SYSTEM THEREFOR

(75) Inventor: Daisuke Suzuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/413,329

(22) Filed: Oct. 12, 1999

(30) Foreign Application Priority Data

Oct. 13, 1998 (JP) .......................................... 10-304715

(51) Int. Cl.[7] .................... G06F 19/00; G06F 17/30; H01L 21/00
(52) U.S. Cl. .................... 700/102; 700/99; 700/121; 438/5; 707/203
(58) Field of Search ................................. 700/3, 11, 12, 700/27, 99–102, 121; 438/5; 707/203

(56) References Cited

U.S. PATENT DOCUMENTS

| 5,838,565 A | * | 11/1998 | Hsieh et al. | 700/100 |
|---|---|---|---|---|
| 6,000,830 A | * | 12/1999 | Asano et al. | 700/100 |
| 6,035,293 A | * | 3/2000 | Lantz et al. | 707/1 |
| 6,115,640 A | * | 9/2000 | Tarumi | 700/100 |
| 6,134,482 A | * | 10/2000 | Iwasaki | 414/14 |
| 6,148,246 A | * | 11/2000 | Kawazome | 700/106 |
| 6,175,777 B1 | * | 1/2001 | Kim | 700/121 |
| 6,230,068 B1 | * | 5/2001 | Wu et al. | 379/14 |
| 6,349,287 B1 | * | 2/2002 | Hayashi | 700/103 |

FOREIGN PATENT DOCUMENTS

JP      08-045929      2/1996

* cited by examiner

*Primary Examiner*—Leo Picard
*Assistant Examiner*—Elliot Frank
(74) *Attorney, Agent, or Firm*—Fitzpatrick, Cella, Harper & Scinto (57) ABSTRACT

A semiconductor manufacturing system for performing a predetermined process in accordance with a job file having a process content set therein. The manufacturing system includes a storage device for memorizing a job file, an accepting device for accepting a job file, a correction device for correcting, on the basis of a process content of a job file already memorized, a process content set in a job file as newly accepted, and a predicting device for predicting a time for completion of the process, on the basis of the job file as already memorized and the job file having its process content corrected by the correction device.

13 Claims, 7 Drawing Sheets

| JOB FILE B | | | JOB FILE A | | |
|---|---|---|---|---|---|
| RETICLE REPLACEMENT TIME | RETICLE TYPE A | | RETICLE REPLACEMENT TIME | RETICLE TYPE A | |
| WAFER REPLACEMENT TIME | IN-LINE, CONTINUOUS | | WAFER REPLACEMENT TIME | IN-LINE, CONTINUOUS | |
| CALIBRATION TIME | 1. PATTERN OFFSET | ON | CALIBRATION TIME | 1. PATTERN OFFSET | ON |
| | 2. DRIVING SENSOR CORRECTION | ON | | 2. DRIVING SENSOR CORRECTION | ON |
| | 3. ILLUMINANCE CORRECTION | ON | | 3. ILLUMINANCE CORRECTION | ON |
| ALIGNMENT TIME | ALIGNMENT MARK INFORMATION UNDERLYING LAYER INFORMATION | | ALIGNMENT TIME | ALIGNMENT MARK INFORMATION UNDERLYING LAYER INFORMATION | |
| EXPOSURE TIME | M/B OPENING AMOUNT | | EXPOSURE TIME | M/B OPENING AMOUNT | |
| STAGE DRIVING TIME | SIZE, LAYOUT INFORMATION | | STAGE DRIVING TIME | SIZE, LAYOUT INFORMATION | |
| FOCUSING TIME | FOCUS (SPEED CENTERED) | | FOCUSING TIME | FOCUS (PRECISION CENTERED) | |

SEMICONDUCTOR DEVICE MANUFACTURING APPARATUS AND INFORMATION PROCESSING SYSTEM THEREFOR

FIELD OF THE INVENTION AND RELATED ART

This invention relates generally to a semiconductor device manufacturing apparatus. More particularly, the invention is concerned with a host system for controlling and operating a production machine or machines used in the manufacture of semiconductor device products, and a production machine and a device manufacturing method adapted to process a process request form such a host system in an optimized manner.

The price of a semiconductor manufacturing apparatus for use in the manufacture of semiconductor device products is increasing, due to recent enlargement of LSI integration density or enlargement of silicon wafer diameter to 300 mm, for example. Reduction of manufacturing cost is, therefore, strongly desired.

In the production field, many attempts have been made to unify the monitoring and control over production machines to improve the machine operation efficiency and to thereby reduce the cost.

A typical arrangement for monitoring and controlling production machines is an on line work system which is based on a superior host system, called a master controller. This is achieved by simple communications such as start and end, for example, made between a host system and production machines, and mainly it accomplishes the confirmation of an operation state of the production machines and the production machine control over sequential operations as programmed beforehand.

Figure 1:
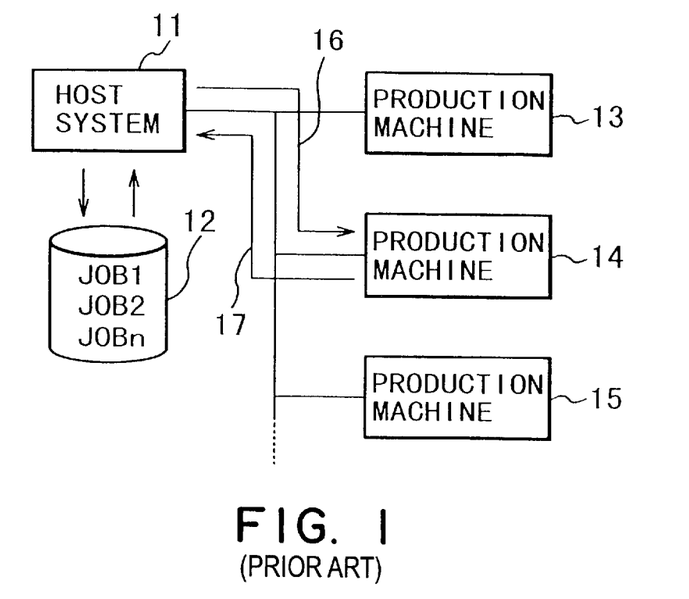
FIG. 1 is a schematic and diagrammatic view of an example of a conventional arrangement of a process requesting host system and process accepting production machines.

FIG. 1 illustrates an example of a system structure including a host system and production machines. Denoted in the drawing at 11 is a host system for monitoring and controlling semiconductor production machines 13, 14 and 15. Denoted at 12 is a job database for storing and controlling a file group, called job files, including process procedures corresponding to the processes to be performed. Denoted at 16 is a process request to be applied from the host system 11 to the production machine 14, in this example. Denoted at 17 is a signal (notification) of process end, to be applied to the host system 11 from the production machine 14. In the arrangement shown in FIG. 1, the host system 11 picks up a file for the process to be performed, out of the job files stored in the job database 12, and selects a particular one of the production machines 13–15. The host system then transfers the job file to the machine upon receipt of on-line instructions, to apply a process request 16 to the machine. The production machine then performs a production process in accordance with the setting in the job file. When the process is completed, it applies a process end notification 17 to the host system 11. Thus, the process procedure in the unit of a job, is completed.

For efficient production machine operation, it is important to predict the processing time of the production machine. However, in the semiconductor manufacture, even in a particular production machine, there is a possibility of changing the procedure in detail in accordance with the process for the product to be produced. As a result, the processing time may be different with different lots, prepared for respective processes. Therefore, it is very difficult to predict the processing time exactly. Conventionally, the prediction of processing time has to rely on experiences of operators.

Japanese Laid-Open Patent Application, Laid-Open No. 45929/1996, discloses processing time prediction wherein the processing time is predicted and displayed, prior to the production process, in accordance with the setting which differs with processes.

In this method of calculating the processing time in accordance with the content of the process, the processing time is predicted on the basis of setting items corresponding to the process to be performed. However, for example, there is a possibility that an automatic maintenance operation or correction operation is performed in accordance with the situation or condition inside a production machine. The predicted processing time may therefore differ from the actual processing time. Further, generally, the process items prepared by a user are set in relation to a production process to be performed, and optimization of the operation may be insufficient. For, as an example, a process which may operate well if executed periodically may be requested successively.

SUMMARY OF THE INVENTION

It is an object of the present invention to provide a semiconductor manufacturing system, a data processing system and/or a device manufacturing method, by which the state of operation of a production machine can be correctly predicted and monitored for on-line control of the same, to thereby improve the efficiency of operation of the production machine in a semiconductor manufacturing process and to thereby increase the productivity of a production factory.

In accordance with an aspect of the present invention, there is provided a semiconductor device manufacturing system, comprising: a production machine operable, in a predetermined process step and in response to acceptance of a process request applied on-line, to perform a process in accordance with the process request; process accepting means operable to accept process requests successively; and calculating means for predicting, by calculation, a required time necessary for completion of a process corresponding to a process request accepted by said process accepting means, said calculating means further being operable to predict, by calculation, a required time necessary for completion of a process corresponding to a second process request, prior to acceptance of the second process request by said process accepting means.

With this arrangement, the operation of the production machine can be monitored and controlled efficiently.

In accordance with another aspect of the present invention, there is provided an information processing system connected, on-line, to a plurality of semiconductor device production machines, comprising: file transmitting means operable to transmit a setting file to each of the production machines; request transmitting means operable to transmit a prediction calculation request to each of the production machines; selecting means for selecting, out of the production machines, a production machine which may be optimum in consideration of the results of a prediction, applied from the production machines, in regard to a required time necessary for completion of a predetermined process; and request applying means for applying a process request to the selected machine, and also for applying a request to each of the remaining production machines to delete the setting files already transmitted to them.

With this arrangement, the operations of the production machines can be monitored and controlled efficiently.

In accordance with a further aspect of the present invention, there is provided a device manufacturing method for use with a plurality of semiconductor device production machines connected, on-line, to an information processing system, wherein each of the production machines is operable, in a predetermined process step and in response to a process request applied thereto on-line, to perform a process corresponding to the process request, said method comprising the steps of: accepting process requests successively; and predicting, by calculation, a required time necessary for completion of a process corresponding to a second process request, prior to acceptance of the second process request.

With this arrangement, the operations of the production machines can be monitored and controlled efficiently, for production of semiconductor devices.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In preferred embodiments of the present invention to be described below, setting files are prepared in relation to respective lots each being the unit of process in production, wherein in each setting file the content of the process to be performed to that lot is recorded. Through such setting files, a host system and production machines are connected online. Each production machine may be provided with a console device, and the console device may function to control the communication with the host system as well as the job execution command to the production machine.

The console device may be equipped with a virtual job arranging function for enabling successive execution of job files. With this function, process requests for successive lots can be accepted, on-line, asynchronously with the actual processing operation being performed in the production machine, corresponding to the lot. Further, in synchronism with the completion of the process for a current lot, the process request for a next lot, having been accepted, can be executed successively.

The console device may be provided with setting processing means for receiving a job file, on-line, and for automatically setting again the file to optimize the same in accordance with the state of operation of the corresponding production machine or of the production machines. With this function, on the basis of the job arrangement, the content of a process in the job file therein can be set again to accomplish optimization of the throughput.

The setting processing means may have a function, in addition to the function of re-setting a job file on the basis of the states of the production machines, for comparing, when there is any accepted process on standby or any process or processes set by the production machines individually and being on standby, the job file having recorded therein the content of a process on standby with the content of a newly accepted job file, and then for finding and deleting any unnecessary process items in the newly accepted job file. This assures process optimization.

In one preferred embodiment of the present invention, the console device may have a function of calculating means. In response to reception of a new job file as well as a prediction calculation request for predicting, by calculation, the required time necessary for a process recorded in that job file, the console device may operate to predict the required time by calculation after optimization of the job file through the setting processing means.

The calculating means may operate to predict, by calculation, the sum of a required time necessary for completing all the processes on standby and a required time necessary for a process recorded in the newly received job file.

With the structure described above, the host system may transfer, to console devices annexed to the production machines, job files having been set in accordance with lots to be produced. Job files as optimized by the console devices may be added to the job array being on standby, and a process completion time as can be predicted by the result of job file addition may be transmitted by the console devices. On the basis of this notification, a production machine with which a job just to be executed can be executed most efficiently can be selected beforehand.

Preferred embodiments of the present invention will now be described in detail, with reference to the accompanying drawings.

Figure 2:
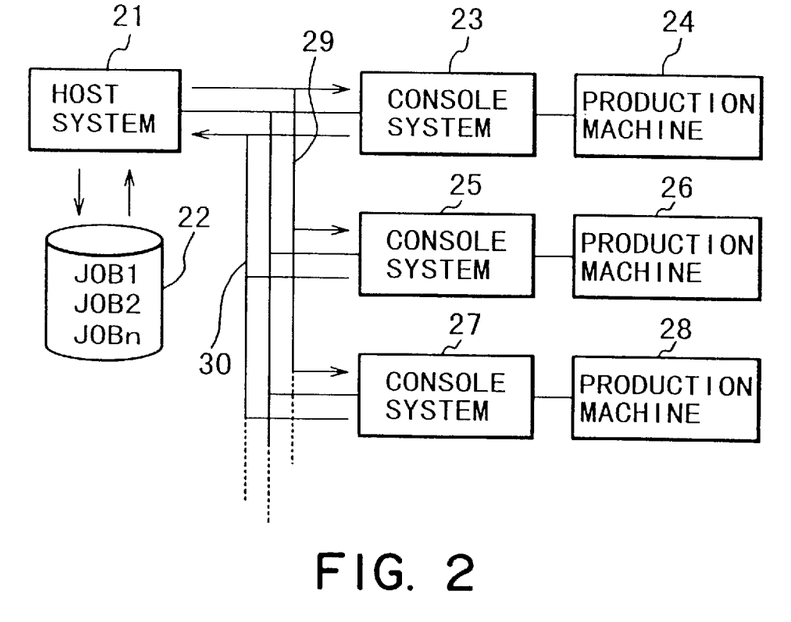
FIG. 2 is a schematic and diagrammatic view of an arrangement of a process requesting host system and process accepting production machines, according to an embodiment of the present invention.

FIG. 2 shows an example of the structure according to an embodiment of the present invention which is applied to a semiconductor device manufacturing system including production machines such as semiconductor exposure apparatuses, for example, for printing a circuit pattern on a silicon wafer. Denoted in the drawing at 21 is a superior host system for controlling a plurality of exposure apparatuses (production machines). Denoted at 22 is a job database provided in a hard disk drive (HDD) and having job files which are prepared in relation to different process lots, respectively, and which have recorded therein various setting data necessary for execution of processes in the production machines, such as an exposure process, for example. Denoted at 23, 25 and 27 are console systems, and denoted at 24, 26 and 28 are production machines. Denoted at 29 are processing time prediction requests from the host system 21 to the console systems 23, 25 and 27. Denoted at 30 are processing time prediction notifications from the console systems 23, 25 and 27 to the host system 21.

As illustrated in the drawing, the superior host system 21 for monitoring and controlling all the production machines, and the console systems 23, 25 and 27 annexed to these production machines 24, 26 and 28, are connected on-line through a network communication mechanism, by which various communications can be made therein. The console systems 23, 25 and 27 are connected to the production machines 24, 26 and 28 one-to-one, and they can control corresponding production machines.

In operation, the host system 21 picks up a job file, to be executed, out of the job database 22 in accordance with the sequence as schemed, and selects a production machine best suited for the execution of the process. The host system 21 transfers the job file to be executed, to all the console systems annexed to the production machines, together with a pre-process request signal for checking the processing time for the job, the transfer being made in a broadband method. The thus transferred job file is received by the console systems and, as shown in FIG. 3, it is inserted after the end of a virtual job array.

Figure 3:
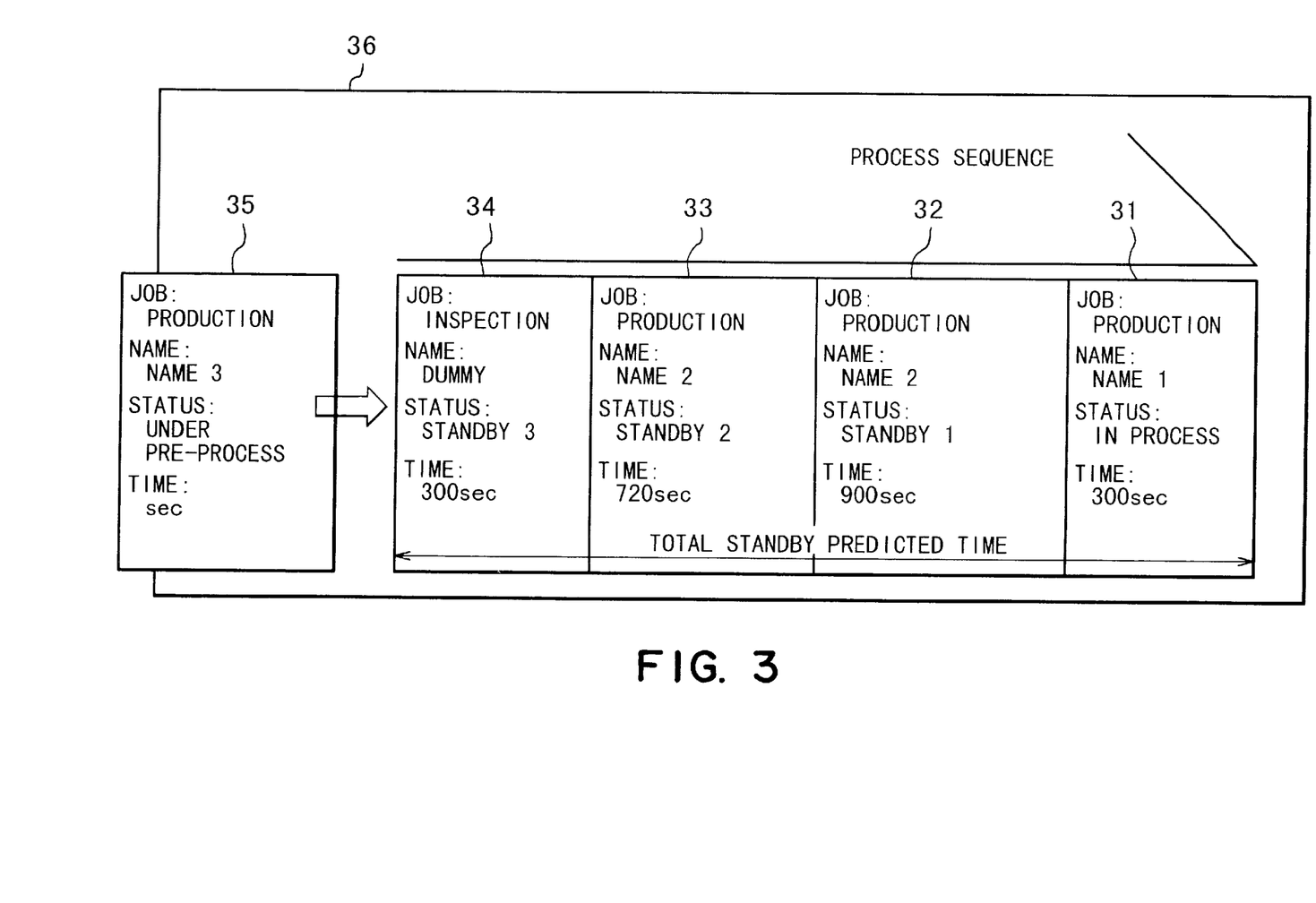
FIG. 3 is a chart for explaining the concept of prediction of job processing time, in an embodiment of the present invention.

FIG. 3 illustrates a sequence in a single console system, wherein a job file requested by the superior host system 21 is processed sequentially in a virtual job array. Denoted in the drawing at 31–35 are headers of the job files in the virtual job array, in the console system 36.

Each job file contains a header for bearing characteristic information about the file itself, and a data area for bearing the set content of the exposure process, for example. The header has four data fields, that is, Job, Name, Status, and Time. Here, the field "Job" represents the property of the job file, and it bears information about production, inspection and the like. For example, this information may concern production, if that job file relates to a command for execution of chip production, and it may concern inspection if the job file specifies the process sequence for the machine calibration in the maintenance. Thus, such information is added to the job file, as the property to be used for the control of the operation state of the production machine through the superior system.

The field "Name" represents the name of the job file, and it is used for selection and control of the job file. A title such as "Dummy", "Idle" or "Maintenance", for example, may be assigned to this "Name" field, so that the state of operation of the production machine can be clearly recognized by an operator. The field "Status" represents the current state of the processing of the job file. If the process of that job file is being executed in a production machine, status information of "in process" will be assigned. If the process is on standby in the virtual job array inside the console system, "standby" will be assigned. If an optimization process for the job file or a time prediction process is being executed in response to a pre-process execution request from the host system, "in pre-process" will be assigned. If the file is kept stored in the job database 22 in the host system 21, "no status" will be assigned. Finally, the field "Time" represents the predicted processing time for execution of the job in the corresponding production machine.

According to the definition of the header described above, in FIG. 3, there are job files 31–35 prepared in the virtual job array in an order to be executed, wherein denoted at 31 is a job file for production which is being currently executed, denoted at 32 is a job file for production which is being on standby at the first turn, denoted at 33 is a job file for production which is being on standby at the second turn, denoted at 34 is a job file for periodic maintenance which is being on standby at the third turn, and denoted at 35 is a job file for production which is just transferred from the host system together with a pre-process request signal. The sum of the time periods in the "Time" fields in the job files, included in the virtual job array, represents the predicted process completion time, in total, in this production machine.

In regard to the job file 35 newly transferred from the host system 21, at the moment whereat it is inserted into the virtual job array, the contents of the header and the data area of the file are checked sequentially in detail by a control program which operates on the console system, and optimization processing therefor for execution of the process in the production machine at highest efficiency is performed.

Figure 4:
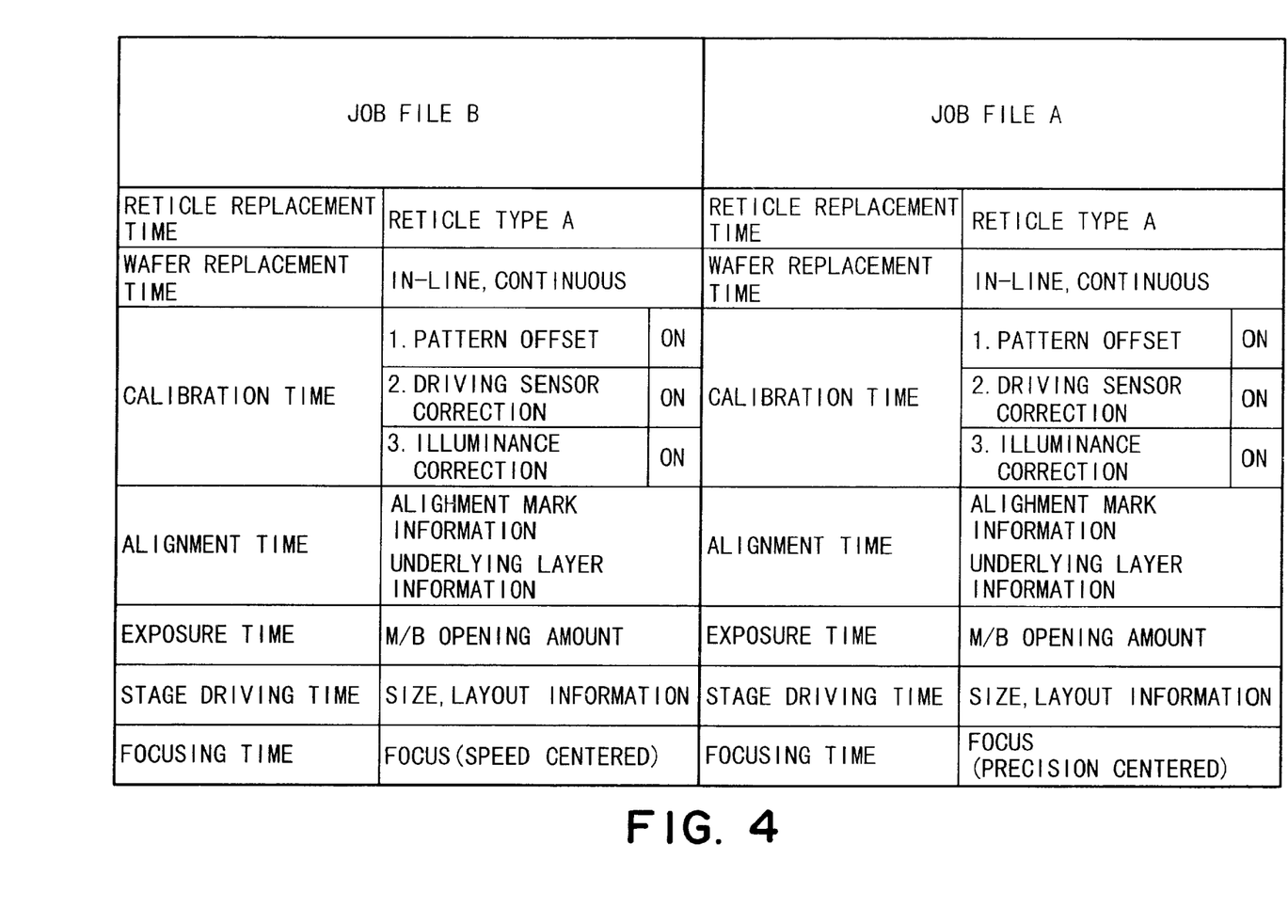
FIG. 4 is a chart for explaining the concept of process optimization based on job connection, in an embodiment of the present invention.

Details of this optimization processing will be described with reference to FIG. 4. FIG. 4 show two job files A and B to be executed successively in a virtual job array, and illustrates the set contents in portions of the job files A and B.

Job file A is a file having been inserted into the virtual job array and having already been optimized. Job file B is a file which is to be newly inserted just after the job file A in the virtual job array. In accordance with the types of the production machines to which the present invention is applied, separate programs are prepared for execution of the optimization. This is because the structure of the data area of the job file is dependent upon the content of the process in the production machine, such that the condition for optimization differs with the production machine. Also, when there is a difference in the content of a process to executed in the same type of production machines, separate programs may be prepared beforehand.

While the job files shown in FIG. 4 concern data areas which are dependent upon a particular semiconductor production machine, the optimization processing of the job file will be explained with reference to this example. In the items for reticle replacement in the job files A and B, the type of reticle is A in both cases. It is therefore expected that the job files A and B concern the printing process for the same layer having the same pattern. Thus, the job file B may be set again so that the reticle replacement process and the reticle alignment process are not executed. Also, in regard to the item for calibration time, correction of illuminance or the like which may be made on the basis of a result of measurement of the transmission factor of a reticle, for example, may be reset to "OFF".

Another example of optimization may be a pattern offset process in the calibration time item, for measuring and calculating offset information to be used for execution of correction of the focus error which may be influence by a ground layer of a wafer. For a lot or lots wherein wafers having patterns of the same shape on their ground layers are to be processed, it is sufficient to execute the measuring and calculating operation once only to the first wafer. Therefore, when the job files A and B have the same ground layer information at their alignment time items, and if the pattern offset process is going to be executed in job file A, execution of a similar process in the job file B is considered excessive, and it is automatically reset to "OFF". Since such information is held continued throughout all the job files connected in the virtual job array, the job file B can be optimized on the basis of the information of all the jobs which are on process standby.

In addition to the function described above, the optimization execution program may include a function for controlling a process for machine calibration, to be executed periodically, by use of a real clock timer function of the console system, for example, and automatically setting it in the job file only as required, or a function for changing the setting if there is any unnecessary parameter set in the file.

Thus, the program functions to execute the optimization in accordance with the characteristic of the production machine.

In regard to the job files thus optimized and re-arranged, the processing time in the unit of a job file is predicted by use of the time prediction function having been described hereinbefore, and the predicted time is recorded on the "Time" field in the header. As the optimization and the time prediction are accomplished, the insertion and setting of a new job file into the virtual job array on the console system is just completed. The total processing completion time is thus renewed.

Figure 5:
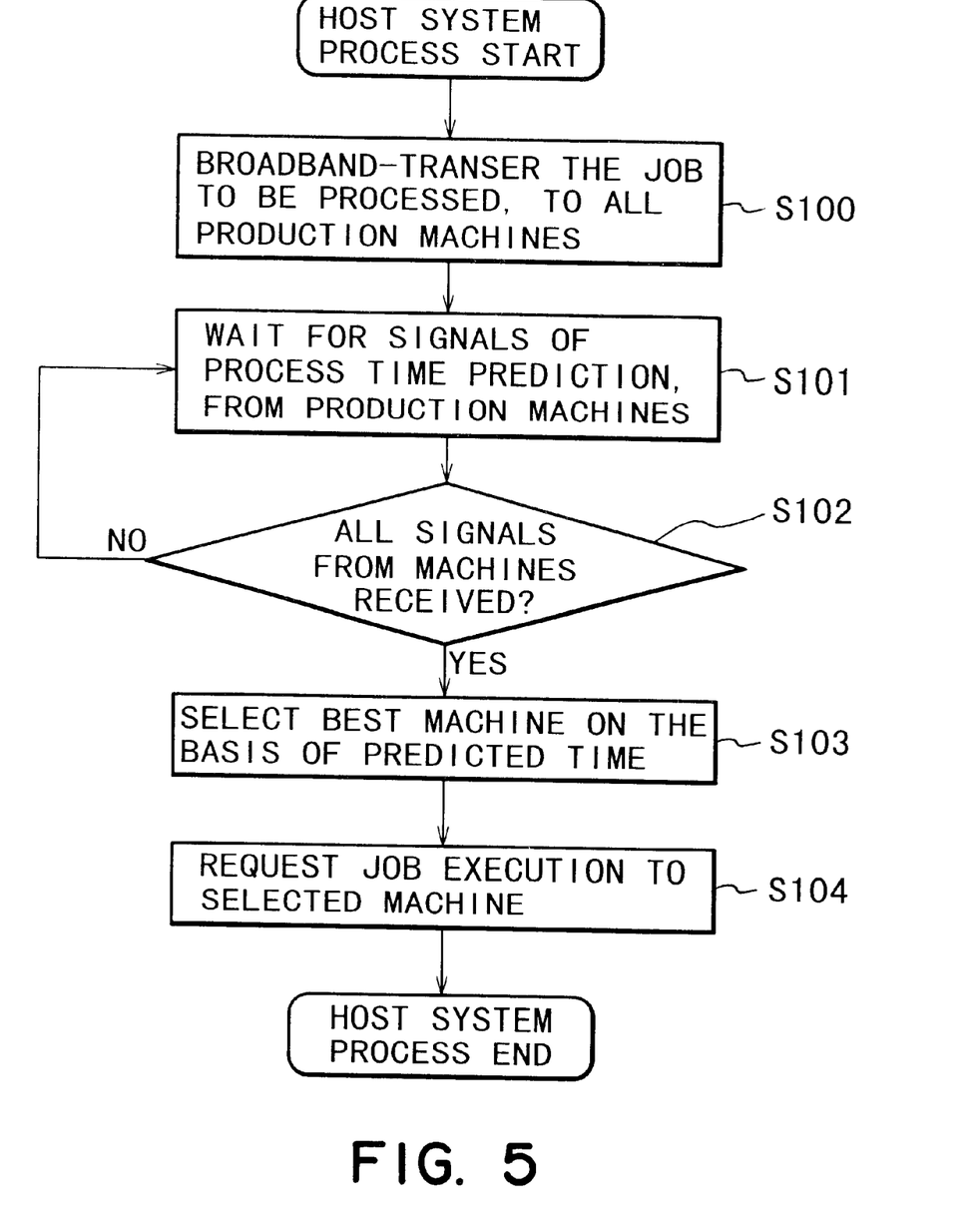
FIG. 5 is a flow chart of sequences to be made in a process requesting host system.
Figure 6:
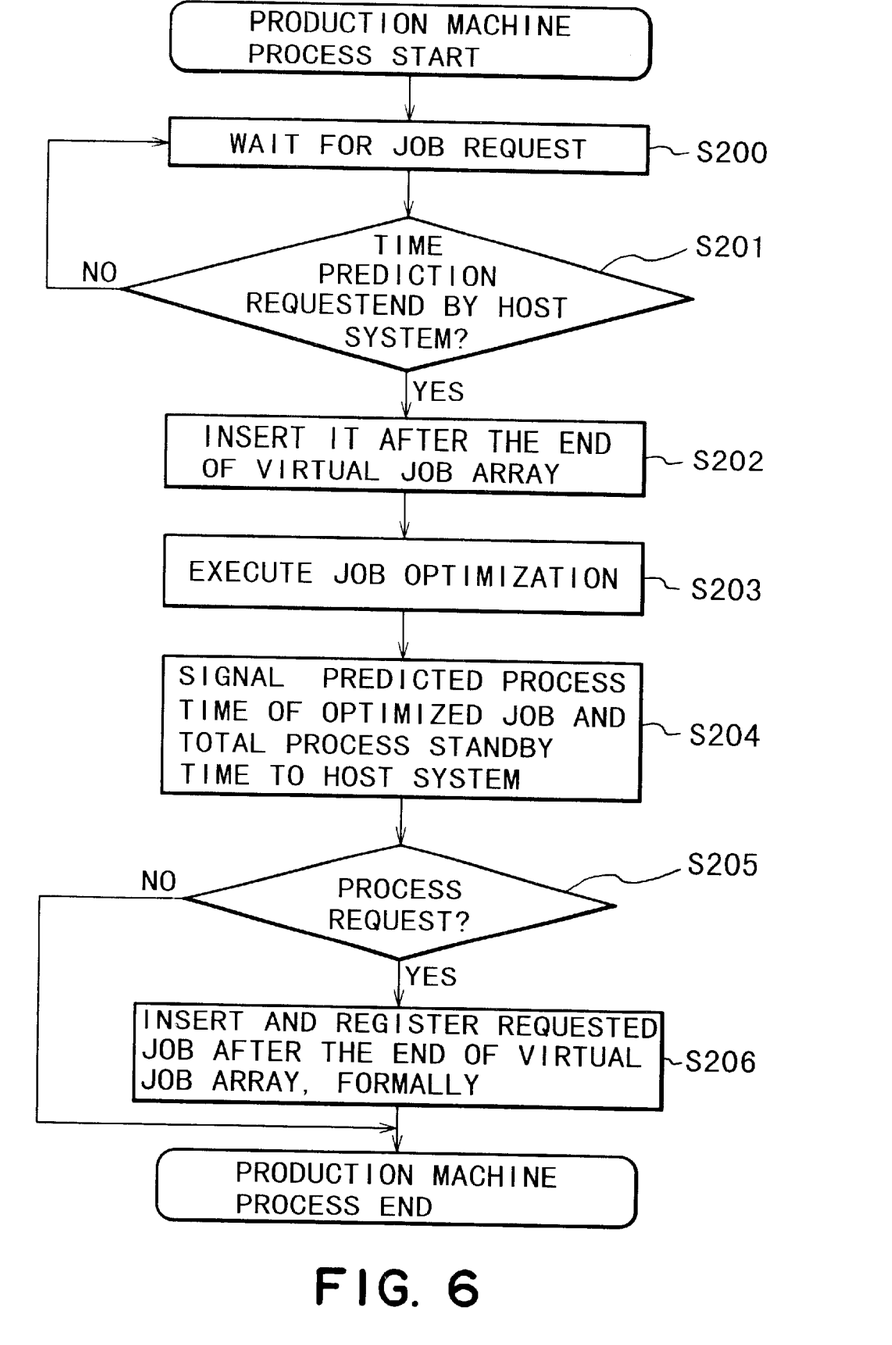
FIG. 6 is a flow chart of sequences to be made in a process accepting production machine.

Referring now to FIGS. 5 and 6, the sequence of a process until a job to be executed is accepted by a production machine, will be explained. The process sequence at the host system 21 side is illustrated in the flow chart of FIG. 5, while the process sequence at the console system (23, 25 or 27) of the production machine (24, 26 or 28) side is illustrated in the flow chart of FIG. 6.

Initially, the host system 21 transfers a job file to be executed, to all the console systems annexed to the production machines, together with a pre-process request signal for checking the job processing time, in a broadband method (Step S100). Then, notifications from these production machines are waited for (Step S101).

On the other hand, generally, each console system is in a standby state waiting for a pre-process request signal to be supplied from the host system (Step S200). The job file transferred from the host system at Step S100 is received by the respective console systems (Step S201) and, as shown in FIG. 3, it is inserted after the end of the virtual job array (Step S202). The job file having been newly transferred from the host system together with a pre-process request signal, is subjected, as it is just inserted into the virtual job array, to an optimization process (Step S203) and a processing time prediction process described hereinbefore, through the control program being in operation inside the console system. The console system then notifies, to the superior host system having requested execution of the pre-process, a predicted processing time (in the unit of a file) of the optimized job file as well as the predicted total processing completion time of the production machine (Step S204). Here, if the production machine is unable to execute the requested job for any reasons such as malfunction, for example, a refusal to the pre-process request is notified.

The superior host system receives prediction notifications from the console systems of all the production machines, in response to the pre-process request (Step S102), and selects a production machine best suited for execution of the job file in question on the basis of the results received (Step S103). The selection of a best machine may be made in any way as desired. For example, one of the production machines with which the process can be completed in a shortest time, may be selected. Alternatively, a production machine with respect to which the optimization made in the console systems, in relation to the job file in question, shows a best result, may be selected. The superior host system then applies again a process request signal to the console system of the thus selected production machine (Step S104). Also, it applies a pre-process request abandonment signal to each of the remaining production machines, not selected.

The console system, if a received signal is a process request, then concludes the presence of a process request at Step S205, and changes the job file having been inserted into the virtual job array in response to the pre-process request, formally into a process on standby in the production machine, which is then registered in the machine (Step S206). Further, if a job abandonment request is applied, the "absence of a process" is concluded at Step S205, and the console system deletes the requested job file from the virtual job array.

In accordance with the embodiments of the present invention as described hereinbefore, the time for completion of all the processes requested in a production machine or machines can be predicted very accurately. Further, by deleting unnecessary works in relation to a process newly requested, the throughput can be improved automatically. Additionally, a superior host is able to obtain information necessary for operating plural production machines, to be monitored and controlled, most efficiently.

Next, an embodiment of a semiconductor device manufacturing method which uses an exposure apparatus such as described above, will be explained.

Figure 7:
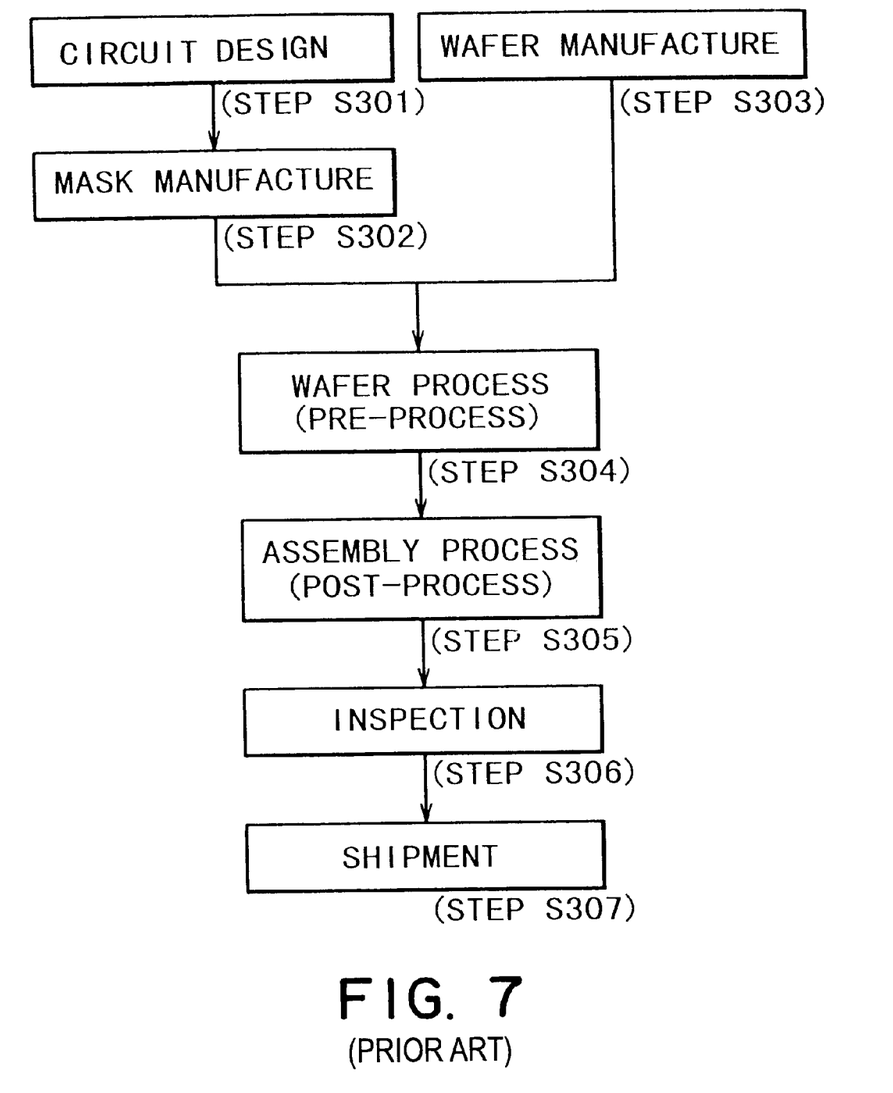
FIG. 7 is a flow chart of a device manufacturing method to which a semiconductor device manufacturing system according to the present invention can be applied.

FIG. 7 is a flow chart of a procedure for the manufacture of microdevices such as semiconductor chips (e.g., ICs or LSIs), liquid crystal panels, CCDs, thin film magnetic heads or micro-machines, for example.

Step S301 is a design process for designing a circuit of a semiconductor device. Step S302 is a process for making a mask on the basis of the circuit pattern design. Step S303 is a process for preparing a wafer by using a material such as silicon. Step S304 is a wafer process (called a pre-process) wherein, by using the so prepared mask and wafer, circuits are practically formed on the wafer through lithography. Step S305 subsequent to this is an assembling step (called a post-process) wherein the wafer having been processed by step S304 is formed into semiconductor chips. This step includes an assembling (dicing and bonding) process and a packaging (chip sealing) process. Step S306 is an inspection step wherein an operation check, a durability check and so on for the semiconductor devices provided by step S305, are carried out. With these processes, semiconductor devices are completed and they are shipped (step S307).

Figure 8:
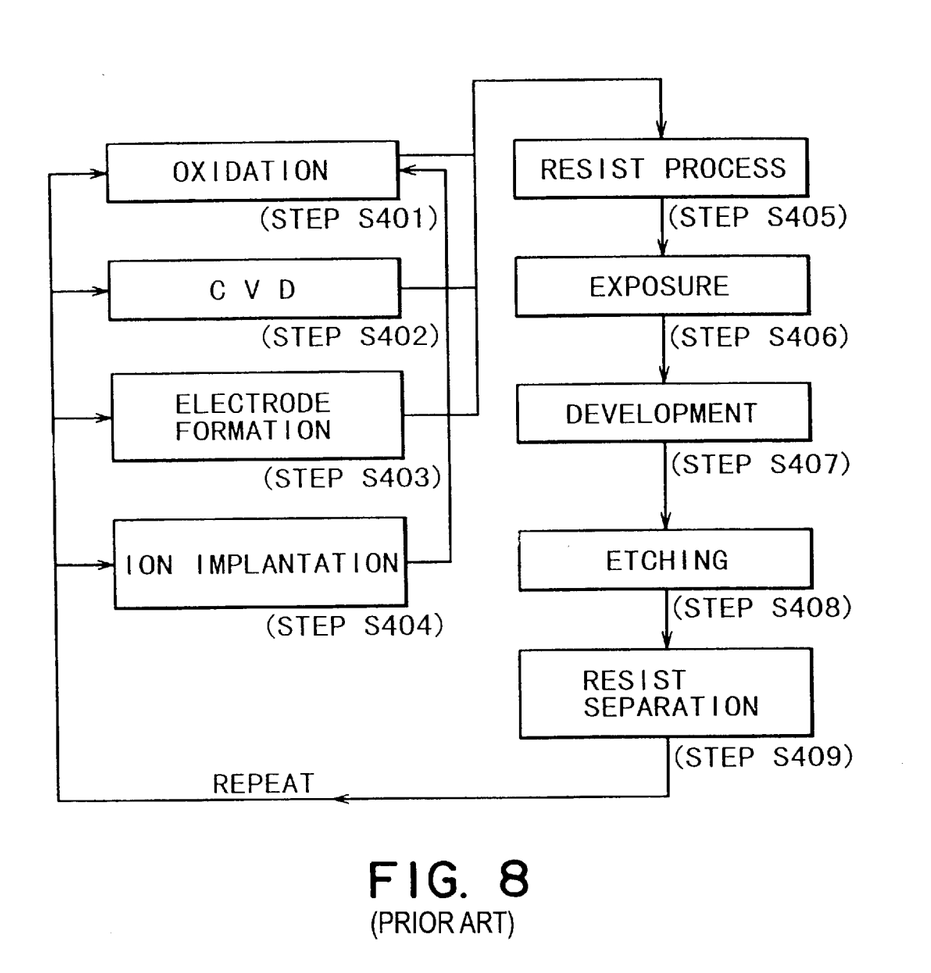
FIG. 8 is a flow chart for explaining details of a wafer process.

FIG. 8 is a flow chart showing details of the wafer process (Step S304).

Step S401 is an oxidation process for oxidizing the surface of a wafer. Step S402 is a CVD process for forming an insulating film on the wafer surface. Step S403 is an electrode forming process for forming electrodes upon the wafer by vapor deposition. Step S404 is an ion implanting process for implanting ions to the wafer. Step S405 is a resist process for applying a resist (photosensitive material) to the wafer. Step S406 is an exposure process for printing, by exposure, the circuit pattern of the mask on the wafer through the exposure apparatus described above. Step S407 is a developing process for developing the exposed wafer. Step S408 is an etching process for removing portions other than the developed resist image. Step S409 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing system, comprising:

a production machine operable, in a predetermined process step and in response to acceptance of a process request applied on-line, to perform a process in accordance with the process request, wherein, in a predetermined process step, said production machine receives, on-line, a setting file having an item of predetermined process content recorded therein and performs a process in accordance with the setting file;

process accepting means operable to accept process requests successively;

calculating means for predicting, by calculation, a required time necessary for completion of a process corresponding to a process request accepted by said process accepting means, said calculating means further being operable to predict, by calculation, a required time necessary for completion of a process corresponding to a second process request, prior to acceptance of the second process request by said process accepting means; and setting processing means for automatically setting again the setting file, for optimization, on the basis of a state of operation of said production machine, wherein said setting processing means is operable to compare a second setting file to be accepted, with a setting file already accepted, and also is operable to find and delete an item of an unnecessary process content in and out of the second setting file.

2. A semiconductor device manufacturing system, according to claim 1, wherein, in response to a prediction calculation request applied on-line to said production machine, said calculating means calculates a required time necessary for completion of a corresponding process, after a corresponding setting file is optimized by said setting processing means.

3. A semiconductor device manufacturing system, according to claim 1, wherein said process accepting means accepts a process request asynchronously with a processing operation of said production machine.

4. A semiconductor device manufacturing system, according to claim 1, wherein said calculating means is operable to predict, by calculation, a sum of a required time necessary for completion of a process or processes corresponding to the setting file or files already accepted and a required time necessary for completion of a process corresponding to a second setting file to be accepted.

5. A semiconductor manufacturing system for performing a predetermined process in accordance with a job file having a process content set therein, said manufacturing system comprising:

storing means for memorizing a job file;

accepting means for accepting a job file;

correcting means for correcting, on the basis of a process content of a job file already memorized in said storing means, a process content set in a job file as newly accepted by said accepting means; and predicting means for predicting a time for completion of the process, on the basis of the job file as already memorized by said storing means and the job file having its process content corrected by said correcting means.

6. A semiconductor device manufacturing system according to claim 5, wherein said accepting means accepts a job file from a host device, through a communication line.

7. A semiconductor device manufacturing system according to claim 5, wherein said accepting means accepts a job file, out of synchronism with a process operation.

8. A semiconductor device manufacturing system according to claim 5, wherein said correcting means operates in accordance with a process content of a job file as already memorized by said storing means, to find and delete an item of an unnecessary process out of a process content set in a job file newly accepted by said accepting means.

9. A semiconductor device manufacturing system according to claim 8, further comprising exposure means for exposing a wafer with a pattern of a reticle, wherein said correcting means is operable to delete one of a reticle changing process, a reticle alignment process and an illuminance correcting process based on a reticle transmissivity, when a reticle type as set in a job file newly accepted by said accepting means is the same as a reticle type set in a job file as already memorized by said storing means.

10. A semiconductor device manufacturing system according to claim 8, further comprising exposure means for exposing a wafer with a pattern of a reticle, wherein said correcting means is operable to delete a focus offset measurement process, when a ground layer of a lot wafer set in a job file newly accepted by said accepting means is the same as a ground layer of a lot wafer set in a job file as already memorized by said storing means.

11. A device manufacturing method for performing a predetermined process by use of a semiconductor device manufacturing system as recited in claim 5.

12. A semiconductor device manufacturing system for performing a predetermined process in accordance with a job file having a process content set therein, said manufacturing system comprising:

storing means for memorizing a job file;

accepting means for accepting a job file; and correcting means for correcting, on the basis of a process content of a job file already memorized in said storing means, a process content set in a job file as newly accepted by said accepting means.

13. An information processing system communicating with a plurality of semiconductor device production machines, said information processing system comprising:

transmitting means for transmitting a job file to each of said semiconductor device production machines, wherein the job file has set therein a process content related to the semiconductor device production machine;

receiving means for receiving, from each semiconductor production machine, information related to a predicted process completion time, wherein the process completion time is obtained by correcting, on the basis of a process content of a job file already memorized by said storing means, a process content of a job file newly transmitted, and then by predicting the process completion time on the basis of the corrected job file; and selecting means for selecting, out of the production machines, a production machine to perform the process, on the basis of the information related to the process completion time as received from each of the semiconductor device production machines.

* * * * *

UNITED STATES PATENT AND TRADEMARK OFFICE
CERTIFICATE OF CORRECTION

PATENT NO. : 6,496,747 B1 Page 1 of 1
DATED : December 17, 2002
INVENTOR(S) : Daisuke Suzuki

It is certified that error appears in the above-identified patent and that said Letters Patent is hereby corrected as shown below:

Drawings,
Figure 4, in the fourth row in the left-hand column under "JOB FILE B,"
"ALIGHMENT MARK" should read -- ALIGNMENT MARK --.
Figure 4, in the forth row in the right-hand column under "JOB FILE A,"
"ALIGHMENT MARK" should read -- ALIGNMENT MARK --.

Column 1,
Line 14, "form" should read -- from --.
Line 27, "on line" should read -- on-line --.

Signed and Sealed this

Thirteenth Day of May, 2003

JAMES E. ROGAN
*Director of the United States Patent and Trademark Office*